INVENTOR
RICHARD H. BERGMAN
BY
B. L. Zangwill
ATTORNEY

INVENTOR
RICHARD H. BERGMAN
BY
B. L. Zangwill
ATTORNEY

United States Patent Office 3,217,180

Patented Nov. 9, 1965

3,217,180

OUTPUT-FOLLOWS-INPUT PULSE AMPLIFIER EMPLOYING A TUNNEL DIODE BISTABLE CIRCUIT HAVING AN INDUCTOR

Richard H. Bergman, Riverton, N.J., assignor, by mesne assignments, to the United States of America as represented by the Secretary of the Navy Filed Aug. 9, 1962, Ser. No. 215,998
12 Claims. (Cl. 307—88.5)

This invention relates to pulse amplifiers, and more particularly relates to a tunnel diode pulse amplifier in which the output follows the input.

Pulse amplifiers are the basic building block of computers. In a computer, information takes the form of a code made up of voltage pulses of the same width and amplitude. These pulses or bits are generated by pulse amplifiers. Consequently, the speed of computers is limited by the rate at which these pulse amplifiers operate.

In the art, vacuum tubes, magnetic cores or transistors are used to build such pulse amplifiers. The speed of operation of vacuum-tube pulse amplifiers is limited by their inter-electrode capacitance and electron transit time; the speed of magnetic cores by their inherent inductance; and the speed of transistors by the minority-carrier storage time. In contrast, the tunnel diode does not depend on any of these effects for its operation. Its primary mechanism of operation is quantum mechanical tunneling of electrons through its junction. This action occurs approximately at the speed of light.

Accordingly, one object of this invention is to provide a faster pulse amplifier.

Another object of this invention is to provide a fast pulse amplifier for use as a computer component in which the output follows the input.

A further object is to provide a fast, tunnel-diode, pulse amplifier which is basically asynchronous in operation.

In accordance with this invention, two tunnel diodes are connected in series. The first tunnel diode serves as a differentiator and provides trigger pulses to the second tunnel diode. To accomplish this, the first tunnel diode is biased so as to provide a bistable stage with static operating points near the knee and valley of its characteristic curve; and the second tunnel diode is biased so as to provide a second bistable state with a load line closer to the horizontal so as to provide a static operating point at the knee and further beyond the valley. An inductor is placed in series with the first tunnel diode and its voltage source. The leading and trailing edges of an input pulse trigger the first tunnel diode from one state to the other, and in so doing change the voltage across this inductor, creating sharp trigger voltage pulses which are passed to the second stage, and which trigger the second stage from one state to the other to provide an output pulse which follows the input pulse.

In one embodiment of this invention the input pulse is applied between the inductor and the anode of the first tunnel diode. In this embodiment the output from the second stage will have the same polarity as the input. This is because the leading edge of the input pulse triggers the diode from a high-current state to a low-current state which creates a positive pulse to be passed to the second stage. The trailing edge of the input pulse switches the first tunnel diode from a low-current state back to a high-current state thus creating the negative pulse to be passed to the second stage.

In another embodiment of this invention the input voltage is applied to the cathode of the tunnel diode which creates an output pulse of the opposite polarity as the input pulse. This is because the leading edge of the input pulse triggers the first tunnel diode from a low current high voltage state to a high current low voltage state to pass the negative pulse to the second stage. The trailing edge of the pulse triggers the first tunnel diode from the high current low voltage state back to the low current high voltage state creating a positive pulse to the second tunnel diode.

Other objects and many of the attendant advantages of this invention will be readily appreciated as the same becomes better understood by reference to the following detailed description when considered in connection with the accompanying drawings wherein.

Figure 1:
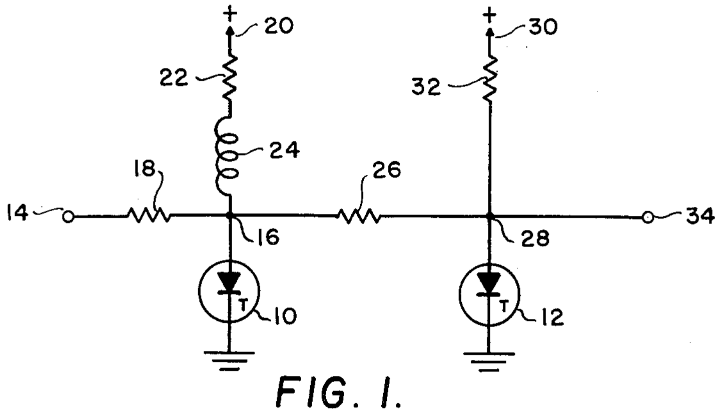
FIG. 1 is a schematic circuit diagram of a pulse amplifier which is one embodiment of the invention.

Referring specifically to FIG. 1, a pulse amplifier is shown in which the output follows the input. The pulses which are to be amplified are applied to the input terminal 14. These pulses are coupled to terminal 16 by input resistor 18. The anode of the tunnel diode 10 is connected to this terminal and has its cathode grounded. The biasing circuit for tunnel diode 10 which consists of D.C. voltage source 20, a resistor 22 and an inductor 24 is also connected to terminal 16. The tunnel diode 10 and its biasing circuit form a first stage of the pulse amplifier and perform the function of amplifying the input pulse so as to provide a pulse of voltage to drive the second stage.

The second stage of the pulse amplifier is coupled to terminal 16 through coupling resistor 26. The trigger pulse from the first stage of the amplifier is coupled to terminal 28 of the second stage of the amplifier across coupling resistor 26. The anode of tunnel diode 12 is connected to this terminal and has its cathode grounded. The bias circuit for the tunnel diode 12, which consists of a source of a D.C. voltage 30 and a resistor 32 is also coupled to terminal 28. The output terminal 34 is connected to this terminal 28 and provides pulses of a fixed amplitude and the width of the input pulse.

Figure 2:
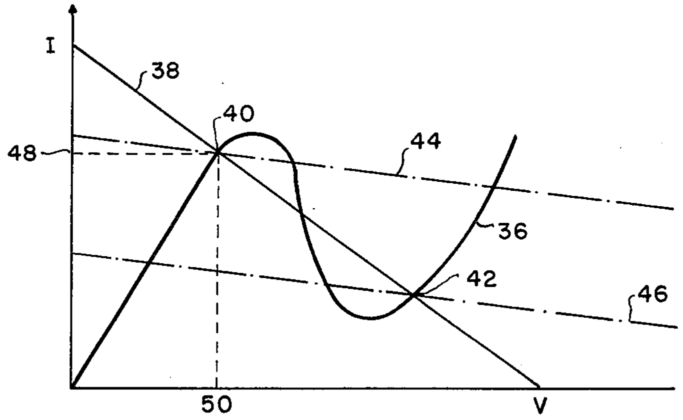
FIG. 2 is a current-voltage characteristic curve of a tunnel diode utilized in the circuit of FIG. 1, in which the abscissae indicate voltage and the ordinates indicate current; and showing a solid static load line and broken dynamic load lines.
Figure 3:
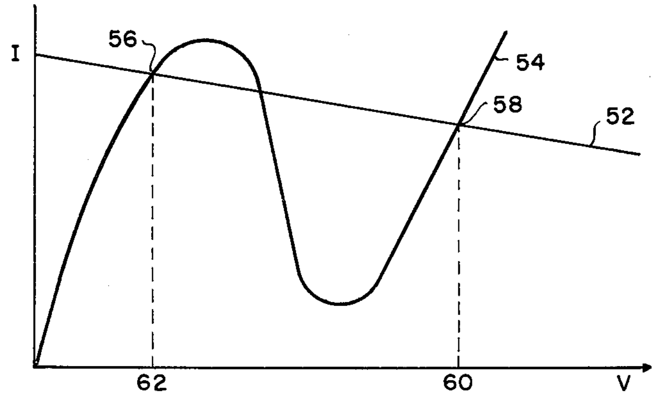
FIG. 3 is a current-voltage characteristic curve of a second tunnel diode, in which the abscissae indicate voltage and the ordinates indicate current, and showing a solid load line.

The tunnel diode 10 and 12 are voltage-stable negative resistance devices with characteristic curves such as those shown in FIGS. 2 and 3, respectively. These tunnel diodes are characterized by a negative conductance region that results when the current falls from an excessively high value at very low forward voltages to a value somewhat like that of a normal p-n junction. Therefore tunnel diodes 10 and 12 are high current, low voltage devices with large negative conductance.

The tunnel diode is a highly doped p-n junction diode. The cause for the negative conductance is that, with a small amount of positive bias, n-material conduction electrons are situated opposite p-material available states at the same level of energy. Quantum mechanics dictates that under this condition there is a finite probability that an electron originally on one side of the junction can appear on the other side at the same energy level by tunneling through the barrier at the speed of light. The tunneling pobability can be made high enough to support large currents. This diode derives its main advantages from this tunneling effect.

The tunnel diode 10 is biased for bistable operation as can be seen from the characteristic curve 36 of this diode as shown in FIG. 2. Static load line 38 intercepts this characteristic curve on the knee of the curve and near the valley, at points 40 and 42 respectively. Dynamic load lines 44 and 46 are also shown.

The function of the first stage of the amplifier shown in FIG. 1 and including tunnel diode 10 is to amplify the input pulse and pass it to the second stage. When there is no voltage input to terminal 14 the tunnel diode 10 has the operating point 40 as shown in FIG. 2. At this time a relatively high current, shown at point 48 on the graph of the characteristic curve, is flowing through the tunnel diode and a voltage shown at point 50 on the same graph appears at terminal 16. This current 48 must also flow through inductor 24.

The leading edge of the input pulse will raise the voltage across tunnel diode 10 along the characteristic curve 36 over the peak and down to the valley. This in turn reduces the current flowing through inductor 24, and changes the voltage across it. The inductor 24, following Lenz's law, will create a voltage tending to keep the current flowing. This voltage will be directly across inductor 24 and equal to its inductance times the rate of change of current caused by the change of voltage across tunnel diode 10. This voltage change will be coupled through resistor 26 to the second stage of the pulse amplifier.

The operating point of the tunnel diode 10 in the first stage is switched from the high-current low-voltage operating point 40 to the low-current high-voltage operating point 42 by the leading edge of the input pulse. The trailing edge of input pulse to terminal 14 has the opposite effect on the first stage. This trailing edge switches the tunnel diode 10 from low current high voltage point 42 to high current low voltage point 40 thus tending to increase the current flow through inductor 24. Again the inductor 24 will resist the change in current by generating a voltage across itself in such a direction as to oppose the change in current. The switching of tunnel diode 10 will create a negative voltage change at terminal 16.

Thus the first stage of the pulse amplifier shown in FIG. 1 generates a positive voltage change when it receives the leading edge of an input pulse and generates a negative voltage change when it receives the trailing edge of an input pulse. The second stage of the pulse amplifier including tunnel diode 12 generates a positive voltage which starts when it receives the first positive voltage change from the first stage and continues this voltage until it receives the negative current caused by the negative voltage of the first stage. Thus the second stage of the pulse amplifier generates a pulse of constant amplitude which follows the input pulse in polarity and width.

Tunnel diode 12 is also biased to be bistable. Its load line 52 intercepts its characteristic curve 54 as shown in FIG. 3. The load line and characteristic curve intersect at operating point 56 near the knee of the characteristic curve and at operating point 58 beyond its valley. The first current pulse from the first stage switches tunnel diode 12 from operating point 56 to operating point 58 to provide relatively high output voltage 60 shown on the abscissa of the graph of FIG. 3. The negative current pulse from the first stage shifts tunnel diode back from operating point 58 to operating point 56 to provide a relatively low output voltage 62 to the terminal 34. Thus the first stage of the pulse amplifier, which includes tunnel diode 10, amplifies the input current to provide a pulse to the second stage of the pulse amplifier, which includes tunnel diode 12. The second stage of the pulse amplifier is switched from a low voltage state and a high voltage state by the current pulses from the first stage to provide a pulse output which follows the input and has the same pulse width.

While the circuit of FIG. 1 has been described in terms of its operation with a positive input pulse, it is obvious that it can also be used with a negative pulse though the biasing of the tunnel diodes would be different for best operation. In either case voltage source 30 and resistor 32 should form a constant-current source. The resistor 32 and the operating points of the tunnel diode are adjusted so that a small input signal is required for triggering to the high state and a reset current is required that is roughly equal to the diodes peak current. The inductive time constant, which is equal to the inductance of 24 divided by the resistance of resistor 22, is adjusted so that it is greater than the worst case switching time for diode 12. When diode 10 is initially switched all of the low current from the first stage is coupled through resistor 26 and used to switch the second stage. Once the second stage is switched, it is in the same voltage state as the first stage and little current flows through resistor 26. If the gain from the first stage is not sufficient to switch the second, stages similar to the first stage may be cascaded. Starting at the input, each succeeding state would require a higher current diode.

Figure 4:
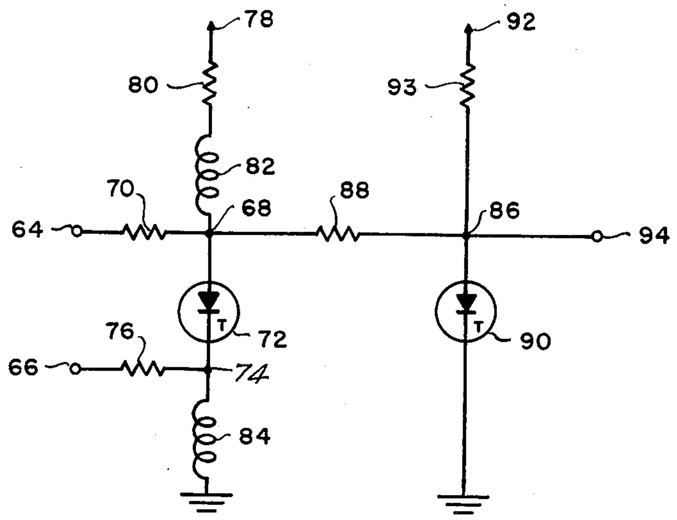
FIG. 4 is a schematic circuit diagram of an inverting pulse amplifier which is another embodiment of the invention.

The circuit of FIG. 4, is the same as that of FIG. 1 except it is drawn to a device which may also invert the input pulse. This inverting pulse amplifier has input terminals 64 and 66. Input terminal 64 is coupled to terminal 68 by input resistor 70. The anode of tunnel diode 72 is connected to terminal 68 and the cathode to terminal 74. Input terminal 66 is coupled to terminal 74 by resistor 76. The biasing circuit for tunnel diode 72, which consists of D.C. voltage source 78 series resistor 80 and inductor 82, is connected to terminal 68; inductor 84 is connected between terminal 74 and ground. Terminal 68 of the first stage is connected to terminal 86 of the second stage through coupling resistor 88. The anode of tunnel diode 90 is connected to terminal 86 and the cathode is connected to ground. D.C. voltage source 92 and series resistor 93 are coupled to terminal 86 to provide biasing for diode 90. The output of the pulse amplifier is taken from terminal 94 which is connected to terminal 86.

The pulse amplifier of FIG. 4 operates in the same manner as the pulse amplifier of FIG. 1 as to pulses applied to terminal 64. The output will amplify these input pulses and follow them. However pulses applied to terminal 66 will be inverted. A pulse applied to terminal 66, if it is positive, will switch diode 72 from the low-current high-voltage state to the high-current low-voltage state thus increasing the current through inductor 82 and causing a negative voltage change to be generated at terminal 68. In the same manner the trailing edge of a positive input pulse to terminal 66 will switch diode 72 from the high-current low-voltage state back to the high-voltage low-current state, thus interrupting the current flow through inductor 82 and causing it to generate a positive voltage change at terminal 68. It can be seen that the voltage pulse generated by the first state is of opposite polarity for a pulse applied to terminals 66 as for one applied to terminal 64. Thus an input pulse will be inverted.

Figure 5:
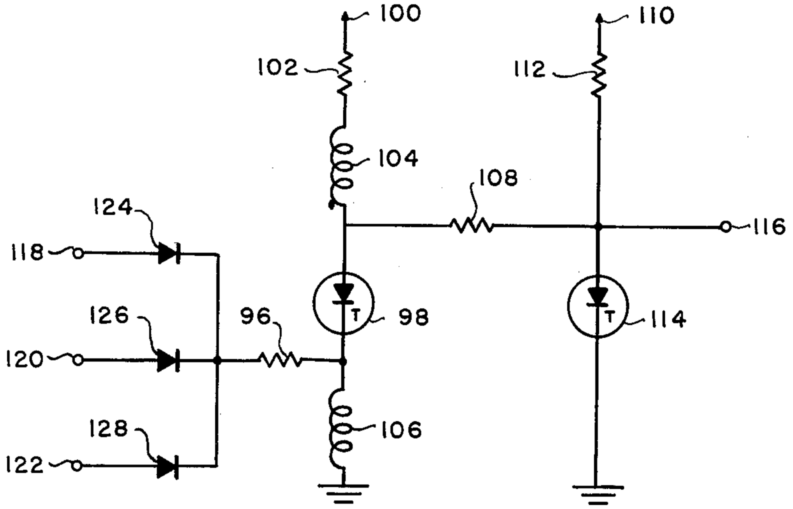
FIG. 5 is a schematic circuit diagram of a "NOR" circuit in which the inverting pulse amplifier of FIG. 4 is used.

The circuit of FIG. 5 illustrates a "NOR" circuit using the inverting pulse amplifier of FIG. 4. The inverting amplifier used in this "NOR" circuit is composed of a differentiating stage and an output stage as shown in FIG. 4. The differentiating stage has input resistor 96 connected to the cathode of tunnel diode 98. A biasing circuit is connected to the anode of tunnel diode 98 and is comprised of a D.C. voltage source 100 in series with a resistor 102 and an inductor 104. An inductor is connected between the cathode tunnel diode 98 and ground.

The first stage of the inverting amplifier is coupled to the second stage through coupling resistor 108 which connects the anodes of the two tunnel diodes. The second stage of this inverting amplifier is connected to D.C. voltage source 110 in series with resistor 112 and connected to the anode of the tunnel diode 114. The cathode of tunnel diode 114 is connected to ground.

Three input terminals are shown for the "NOR" circuit of FIG. 5. A diode rectifier is placed in series with each of the three input terminals 118, 120 and 122. The three series combinations of an input terminal and diode rectifier are in parallel and each connected to input resistor 96. The input resistor 96 must be larger than the forward resistance of any of the diode rectifiers 124, 126, or 128. It can be seen, then, that a positive input pulse on any one of the terminals 118, 120 and 122 will result in a negative pulse from output terminal 116.

The pulse amplifier of this invention is basically asychronous in nature. Computers built of such components are free from the necessity of using expensive timing pulse circuitry. The new pulse amplifier is also very fast operating and substantially free from degradation due to radiation, primarily because it operates with majority carriers rather than minority carriers. In addition, the amplifier can operate over wider range of temperatures than most transistors, and has desirable noise free characteristics.

Obviously many modifications and variations of the present invention are possible in the light of the above teachings. It is therefore to be understood that within the scope of the appended claims the invention may be practiced otherwise than as specifically described.

What is claimed is:

1. A pulse amplifier in which the output follows the input comprising:
(a) an input terminal for receiving an input pulse;
(b) a first bistable device electrically connected to said input terminal;
(c) said first bistable device including a first voltage source, a first resistor, and a first inductor connected in series to a first electrode of a negative resistance device which has a second electrode grounded;
(d) a second bistable device electrically connected to said first bistable device; and
(e) an output terminal;
whereby said input pulse sets and resets said first bistable device and said first bistable device sets and resets said second bistable device to provide an output which follows the input.

2. A pulse amplifier in which the output follows the input as defined in claim 1, in which said first resistor and said first inductor have an inductive time constant, equal to the ratio of the inductance to the resistance, which ratio is greater than the worst-case switching time for said second bistable device.

3. A pulse amplifier in which the output follows the input as defined in claim 2, in which said second bistable device comprises:
(a) a second voltage source;
(b) a second resistor electrically connected in series to said voltage supply; and
(c) a second negative resistance device having a first electrode connected to said second resistor and having a second electrode grounded;
(d) said second resistor also being electrically connected to said first bistable device and said output terminal.

4. A pulse amplifier comprising:
(a) a first negative resistance circuit having a characteristic curve including a knee and a valley biased such that its Direct Current load line crosses its characteristic curve near the knee and the valley, said first circuit comprising:
(b) a first voltage source;
(c) a first inductor electrically connected in series to said voltage source; and
(d) a first negative resistance element having a first electrode connected in series to said inductor and having a second electrode connected to ground;
(e) a second negative resistance circuit having a characteristic curve including a knee and a valley in cascade with said first negative resistance circuit and biased such that its Direct Current load line crosses its characteristic curve near the knee and beyond the valley;
(f) an input circuit electrically connected to first negative resistance circuit, whereby an input pulse to said input circuit is passed to said first negative resistance circuit and moves the operating point of said first negative resistance circuit from one of the points at which the Direct Current load line crosses its characteristic curve to the other point and back to the first point;
(g) a coupling circuit electrically connected to said first negative resistance circuit and to said second negative resistance circuit, whereby the operating point of said second negative resistance circuit is switched from one of the points at which the Direct Current load line crosses its characteristic curve to the other point and back to the first point by energy transmitted through said coupling circuit when the operating point of said first negative resistance circuit is changed; and
(h) an output circuit electrically connected to said second negative resistance circuit, whereby an output pulse occurs which follows said input pulse.

5. A pulse amplifier as defined in claim 4, in which said first negative resistance element is of the voltage stable type.

6. A pulse amplifier as defined in claim 5, in which said first negative resistance element is a tunnel diode.

7. A pulse amplifier as defined in claim 4, in which said first negative resistance circuit further includes:
(a) a resistor in series with said first inductor;
(b) said resistor and said inductor having an inductive time constant, equal to the ratio of the inductance to the resistance, which ratio is greater than the worst-case switching time for said second negative resistance circuit.

8. A pulse amplifier comprising:
(a) a first tunnel diode having an anode and a grounded cathode biased such that its Direct Current load line crosses its characteristic curve near the knee and valley;
(b) a second tunnel diode having an anode and a grounded cathode in cascade with said first tunnel diode and biased such that its Direct Current load line intersects its characteristic curve near the knee and beyond the valley;
(c) an input circuit, a first bias circuit and a coupling circuit each connected to the anode of said first tunnel diode; and
(d) said coupling circuit, a second bias circuit and an output circuit each connected to the anode of said second tunnel diode;
(e) said first bias circuit being inducted, whereby said first bias circuit remains at a high voltage for a short time after said first tunnel diode is switch to its high state by an input pulse due to the inductance of the bias circuit.

9. A pulse amplifier in which the output follows the input as defined in claim 1, in which said first bistable device comprises:
(a) a first voltage source;
(b) a first inductor electrically connected in series to said first voltage source;
(c) a first negative resistance means having a first electrode electrically connected in series to said first inductor and also electrically connected to said second bistable device; and
(d) a second inductor electrically connected in series to a second electrode of said first negative resistance means and to ground.

10. An inverting amplifier, comprising:

(a) a first input circuit having an input terminal;
(b) a first bistable device;
(c) said first bistable device including a voltage supply, a first inductor, a voltage-stable negative-resistance element, and a second inductor connected together in series;
(d) a second bistable device; and
(e) an output terminal;
(f) said input terminal, first bistable device, second bistable device and output terminal being connected in series.

11. An inverting amplifier as defined in claim 10, in which said first input circuit is electrically connected between said voltage-stable negative-resistance element and said second inductor, whereby the leading edge and trailing edge of a pulse applied to said first input circuit each switch said first bistable device from one state to the other state to apply an inverted pulse to said second bistable device such that an inverted replica of said input pulse appears at said output terminal.

12. An inverting amplifier as defined in claim 11, which further comprises a second input circuit electrically connected between said first inductor and said voltage-stable negative-resistance element.

References Cited by the Examiner

UNITED STATES PATENTS

| | | | |
|---|---|---|---|
| 2,975,377 | 3/61 | Price et al. | 307—88.5 |
| 3,103,600 | 9/63 | Lewin | 307—88.5 |
| 3,119,935 | 1/64 | Samusenko | 307—88.5 |

OTHER REFERENCES

Proceedings of the IRE, September 1961, page 1445, Correspondence, "One-Tunnel-Diode Binary," by A. L. Whetstone.

ARTHUR GAUSS, *Primary Examiner.*